(12) United States Patent
Geng

(10) Patent No.: US 10,277,064 B2
(45) Date of Patent: Apr. 30, 2019

(54) POWER TOOL AND CONTROL METHOD THEREOF

(71) Applicants: Nanjing Chervon Industry Co., Ltd., Nanjing (CN); Chervon (HK) Limited, Wanchai (HK)

(72) Inventor: Zheng Geng, Nanjing (CN)

(73) Assignees: Nanjing Chervon Industry Co., Ltd., Nanjing (CN); Chervon (HK) Limited, Wanchai (HK)

(*) Notice: Subject to any disclaimer, the term of this patent is extended or adjusted under 35 U.S.C. 154(b) by 0 days.

(21) Appl. No.: 15/578,088

(22) PCT Filed: Jun. 3, 2016

(86) PCT No.: PCT/CN2016/084658
§ 371 (c)(1),
(2) Date: Nov. 29, 2017

(87) PCT Pub. No.: WO2016/192663
PCT Pub. Date: Dec. 8, 2016

(65) Prior Publication Data
US 2018/0152043 A1    May 31, 2018

(30) Foreign Application Priority Data
Jun. 3, 2015    (CN) .......................... 2015 1 0297572

(51) Int. Cl.
*H01M 10/0525*    (2010.01)
*H02J 7/34*    (2006.01)
(Continued)

(52) U.S. Cl.
CPC .............. *H02J 7/34* (2013.01); *A01D 34/006* (2013.01); *G01R 31/3835* (2019.01);
(Continued)

(58) Field of Classification Search
CPC ...... C01G 43/06; A01D 34/006; A01D 34/78; G01R 31/362; H01M 10/0525;
(Continued)

(56) References Cited

U.S. PATENT DOCUMENTS

2012/0319483 A1* 12/2012 Scruggs ................ B60R 16/033
307/52
2014/0265604 A1* 9/2014 Mergener .............. H02J 7/0063
307/80

FOREIGN PATENT DOCUMENTS

| CN | 103516039 A | 1/2014 |
| CN | 103606943 A | 2/2014 |
| JP | 2006174596 A | 6/2006 |

OTHER PUBLICATIONS

ISA/CN, Int. Search Report issued on PCT application No. CN2016/084658, dated Sep. 5, 2016, 2 pages.

* cited by examiner

*Primary Examiner* — Muhammad S Islam
(74) *Attorney, Agent, or Firm* — Greenberg Traurig, LLP

(57) ABSTRACT

A power toolcapable of being balance powered by multiple battery packs is provided. A power tool comprising: a motor; a first battery pack; a second battery pack; a first battery receptacle for receipt of the first battery pack; a second battery receptacle for receipt of the second battery pack; a first switch device for connecting to the first battery pack and the motor; a second switch device for connecting to the second battery pack and the motor; and a controller operable to send a signal to cause the switch device opened so as to disconnect the battery pack and the motor when the voltage of the switch device is less than a control voltage.

16 Claims, 6 Drawing Sheets

(51) Int. Cl.
*H02J 7/00* (2006.01)
*A01D 34/00* (2006.01)
*H01M 2/10* (2006.01)
*H01M 10/42* (2006.01)
*H01M 10/48* (2006.01)
*H02P 7/00* (2016.01)
*G01R 31/3835* (2019.01)
*A01D 34/78* (2006.01)

(52) U.S. Cl.
CPC ..... *H01M 2/1022* (2013.01); *H01M 10/0525* (2013.01); *H01M 10/425* (2013.01); *H01M 10/48* (2013.01); *H02J 7/00* (2013.01); *H02J 7/0013* (2013.01); *H02J 7/0026* (2013.01); *H02P 7/00* (2013.01); *A01D 34/78* (2013.01); *H01M 2220/30* (2013.01); *H02J 2007/0067* (2013.01)

(58) Field of Classification Search
CPC ............... H01M 10/425; H01M 10/48; H01M 2220/30; H01M 2/1022; H02J 2007/0067; H02J 7/00; H02J 7/0013; H02J 7/0026; H02J 7/34; H02P 7/00
See application file for complete search history.

POWER TOOL AND CONTROL METHOD THEREOF

This application claims the benefit of CN 201510297572.5, filed on Jun. 3, 2015, the disclosure of which is incorporated herein by reference in their entirety.

FIELD OF THE DISCLOSURE

The present disclosure relates generally to power tools, and more particularly to lawn and garden power tools.

BACKGROUND OF THE DISCLOSURE

Traditionally, a power tool such as mower is powered by high-capacity AC power source or a DC battery power source.

Generally, connecting a number of batteries or battery packs in parallel increases the power capacity for the power tool. However, if the respective voltages of the battery packs connected in parallel are not equal, current from the battery pack at a high voltage will flow into the battery pack at a low voltage, reverse charging can occur in the battery or the battery pack having a lower voltage. This will affect the efficiency of the power supply.

The statements in this section merely provide background information related to the present disclosure and may not constitute prior art.

SUMMARY

In one aspect of the disclosure, a power tool comprises a motor, a first battery pack having a first battery, a second battery pack having a second battery connected in parallel with the first battery, a first battery receptacle for receipt of the first battery pack, a second battery receptacle for receipt of the second battery pack, a first switch device being connected between the first battery and the motor so as to form a first electrical connection between the first battery and the motor or cut off the first electrical connection between the first battery and the motor, a second switch device being connected between the second battery and the motor so as to form a second electrical connection between the second battery and the motor or cut off the second electrical connection between the second battery and the motor, and a controller operable to detect a first voltage drop across the first switch device along the current direction; and control the first switch device opened to cut off the first electrical connection between the second battery and the motor when the first voltage drop is less than a first control voltage; detect a second voltage drop across the second switch device along the current direction, and control the second switch device opened to cut off the electrical connection between the second battery and the motor when the second voltage drop is less than a second control voltage; detect a voltage of the first battery pack, and cut off the connection of the first battery pack and the motor when the voltage of the first battery pack is less than a first voltage threshold; and detect a voltage of the second battery pack, and cut off the connection of the second battery pack and the motor when the voltage of the second battery pack is less than a second voltage threshold.

Further, the first control voltage value is greater than zero.
Further, the first switch device is field effect transistor.
Further, the second switch device is afield effect transistor.
Further, the first switch device is electrically connected to the second switch device such that the first battery pack and the second battery pack are connected in a parallel when both of the first switch device and the second switch device is on.

Further, the first battery pack and the second battery pack are lithium cell and have the same nominal voltage and the same battery pack interface.

Further, the power tool is mower which comprises a body, the first battery receptacle and the second battery receptacle are set in a line on the body.

In another aspect of the disclosure, a power tool adapted to be connected with a plurality of battery packs each having a positive electrode and a negative electrode thereof and comprises a plurality of battery receptacles each including a positive terminal for connecting the positive electrode of the battery pack and a positive node, and a negative terminal for connecting the negative electrode of the battery pack and a negative node; a plurality of switch devices adapted for the respective battery receptacles, each of the switch devices including a first switch terminal connectable with the negative node, and a second switch terminal connectable with the negative terminal of the battery receptacle; a motor connected between the positive node and the negative node; and a controller operable to detect a voltage drop between the first switch terminal and the second switch terminal of a respective switch device along the current direction, and control the switch device opened so as to cut off the electrical connection between the first switch terminal and the second switch terminal when the voltage drop of the switch device is less than a control voltage.

Further, the switch device is a field effect transistor.
Further, the first battery pack and the second battery pack are lithium cell and have the same nominal voltage and the same battery pack interface.

In another aspect of the disclosure, a method of controlling a power tool with a plurality of battery packs each having a positive electrode and a negative electrode, wherein the power tool comprises a plurality of battery receptacles each including a positive terminal for connecting the positive electrode of the battery pack and a positive node, and a negative terminal for connecting the negative electrode of the battery pack and a negative node; a plurality of switch devices each connected in series with the respective battery pack and the power tool, the switch device including a first switch terminal connected with the negative node and a second switch terminal connected with the negative terminal of the battery receptacle; a motor connected between the negative node and the positive node; and a controller for controlling the switch device and the motor, the method includes closing the plurality of switch devices; detecting a voltage drop between the first switch terminal and the second switch terminal of each of the switch devices along the current direction; judging whether the voltage drop across the respective switch device is less than a control voltage; controlling the switch device opened to disconnect the battery pack with the motor when the voltage drop of the switch device is less than the control voltage.

Further, the predetermined value is greater than zero.
Further, the plurality of switch devices is connected in parallel, the plurality of battery packs are placed in a parallel configuration.

Further, detecting a current voltage of a respective battery pack by the controller, interrupting the connection of the battery pack and the motor when the current voltage of the battery pack detected is less than a voltage threshold, Further, the first battery pack and the second battery pack are lithium cells with a same nominal voltage and as a same battery pack interface.

Further areas of applicability will become apparent from the description provided herein. It should be understood that the description and specific examples are intended for purposes of illustration only and are not intended to limit the scope of the present disclosure.

Figure 1:
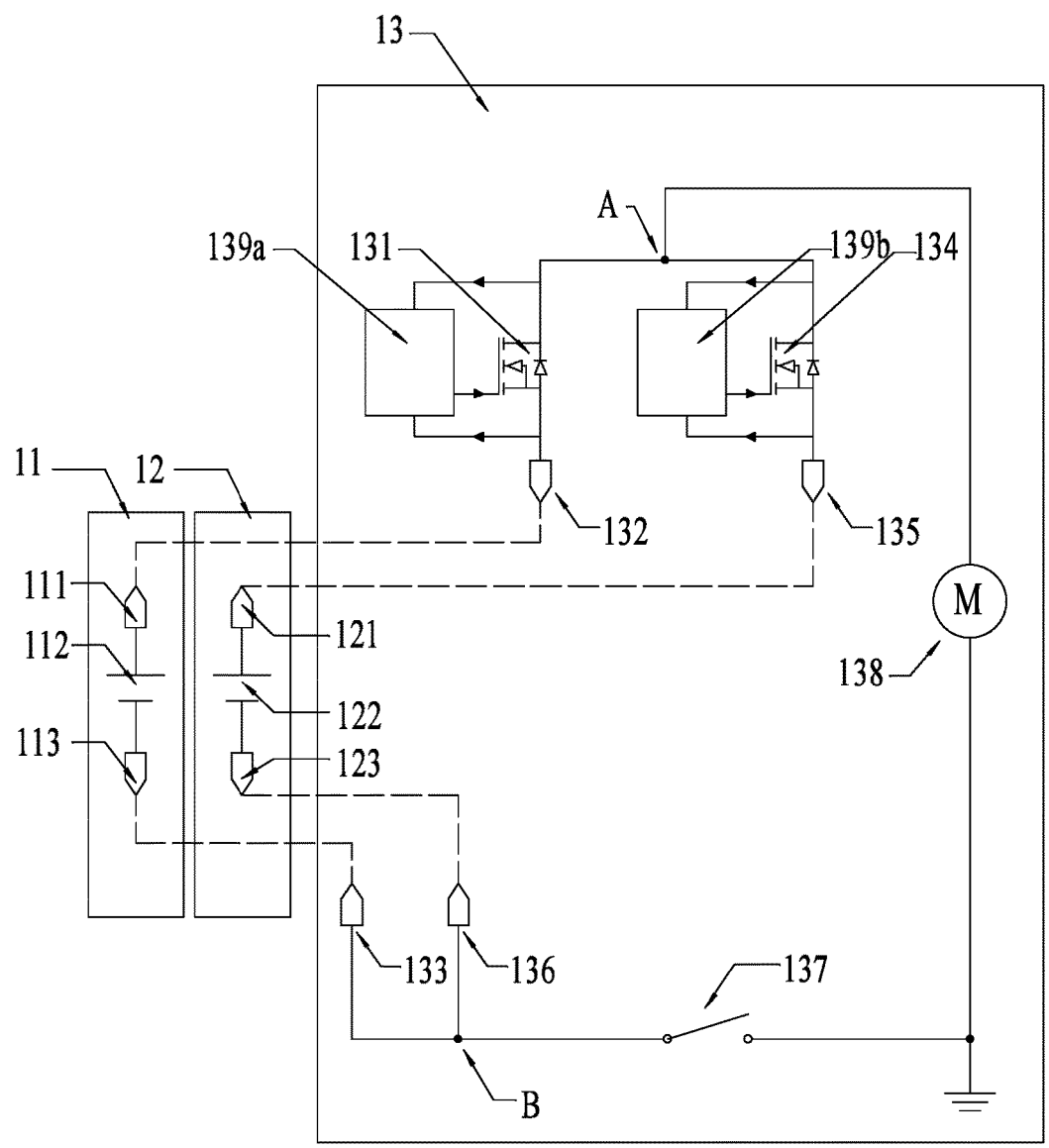
FIG. 1 illustrates an exemplary power tool with battery packs.

The drawings described herein are for illustrative purposes only of exemplary embodiments and not all possible implementations, and are not intended to limit the scope of the present disclosure. Corresponding reference numerals indicate corresponding parts throughout the several views of the drawings.

DETAILED DESCRIPTION

The following description of the preferred embodiments is merely exemplary in nature and is in no way intended to limit the invention, its application, or uses.

Figure 2:
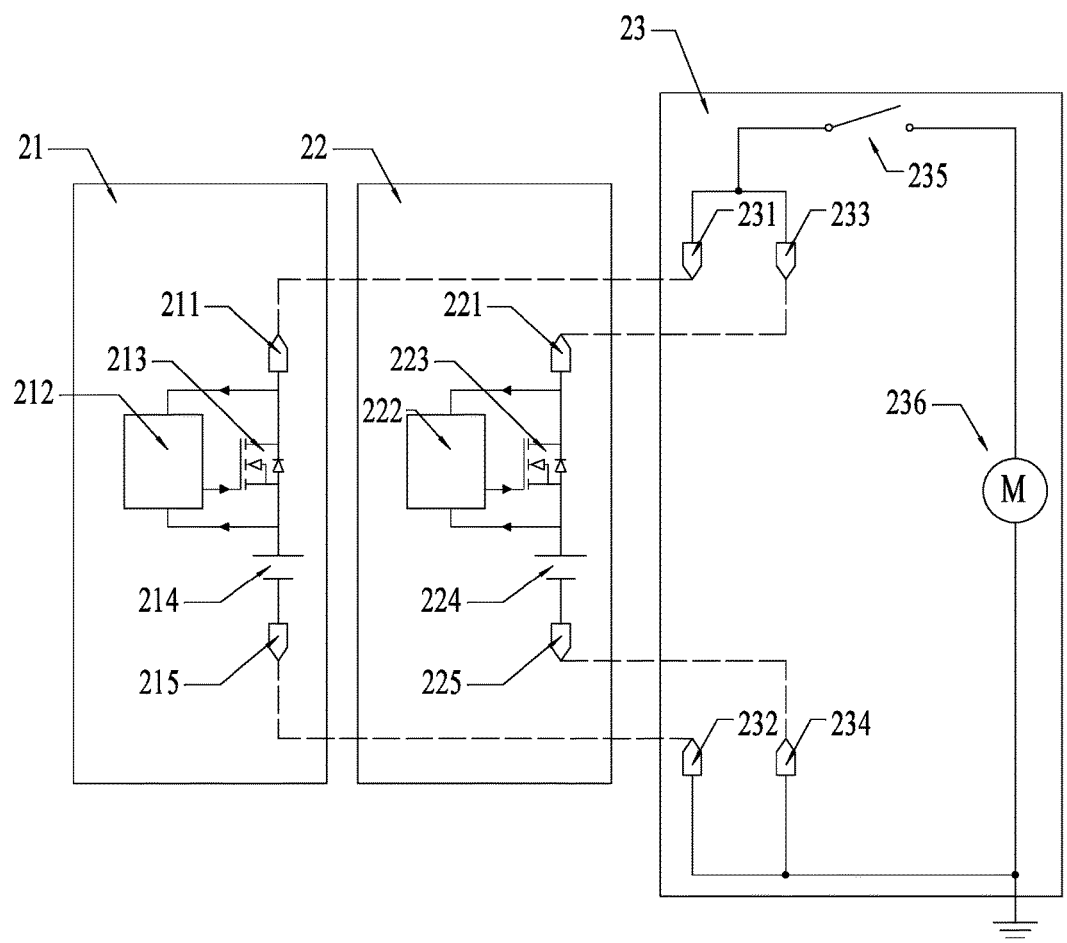
FIG. 2 is a circuit diagram illustrating one exemplary circuit of the power tool with battery packs.

As shown in FIG. 1-FIG. 2, a first battery pack 11 and a second battery pack 12 are used to power a power tool 13. The first battery pack 11 and a second battery pack 12 may be the same battery pack or not. The first battery pack 11 and the second battery pack 12 may also be combined for powering the additional power tool.

The first battery pack 11 and the second battery pack 12 are lithium batteries or li-ion batteries, and have a same nominal voltage and a same battery pack port. The first battery pack has a first battery, and the second battery pack has a second battery connected in parallel with the first battery.

Referring to FIG. 2, the first battery pack 11 includes a first positive pole 111, a battery 112 and a first negative pole 113. The first positive pole 111 connects to a positive pole of the battery 112 as a positive pole of the first battery pack 11 for outputting electric energy. The first negative pole 113 connects to a negative pole of the battery 112 as a negative pole of the first battery pack 11 for outputting electric energy. In an alternative embodiment, the battery 112 may be composed of a plurality of connected battery cells.

The second battery pack 12 includes a second positive pole 121, a battery 122 and a second negative pole 123. The second positive pole 121 connects to a positive pole of the battery 122 as a positive pole of the second battery pack 12 for outputting electric energy. The second negative pole 123 connects to a negative pole of the battery 122 as a negative pole of the second battery pack 12 for outputting electric energy. In an alternative embodiment, the battery 122 may be composed of a plurality of connected battery cell.

A power tool 13 comprises a first battery receptacle 101 for receipt of the first battery pack 11 and a second battery receptacle 102 for receipt of the second battery pack 12.

The first battery receptacle 101 includes a first positive terminal 132 and a first negative terminal 133. The first positive terminal 132 connects to the first positive pole 111. The first negative terminal 133 connects to the first negative pole 113.

The second battery receptacle 102 includes a second positive terminal 135 and a second negative terminal 136. The second positive terminal 135 connects to the second positive pole 121. The second negative terminal 136 connects to the second negative pole 123.

Both of the first positive terminal 132 and the second positive terminal 135 to a positive node A. Both of the first negative terminal 133 and the second negative terminal 136 connect to a negative node B.

The power tool 13 further comprises a first switch device 131, a second switch device 134, a motor 138 and a controller 139.

The motor 138 connects between the positive node A and the negative node B.

The first switch device 131 is connected between the first battery or battery pack and the motor so as to form a first electrical connection between the first battery and the motor or cut off the first electrical connection between the first battery and the motor, and the second switch device 134 is connected between the second battery or battery pack and the motor so as to form a second electrical connection between the second battery and the motor or cut off the second electrical connection between the second battery and the motor. The first switch device 131 is set between the positive node A and the positive terminal 132. A first switch terminal of the first switch device 131 connects to the positive node A, and a second switch terminal of the first switch device 131 connects to the first battery receptacle 101 or the positive terminal 132. The first switch device 131 is closed to form the electrical connection between the first battery or battery pack and the motor, or opened to cut off the electrical connection of the first battery or battery pack and the motor 138.

In one embodiment, the first switch device 131 includes one or more transistors such as MOSFETs or power MOSFETs. In one form, the first switch device 131 is a field effect transistor. In another form, the first switch device 13 is a circuit module with a similar switch function. The circuit module also has a first connection point or terminal for connecting to the positive node A and a second connection point or terminal for connecting to the first positive terminal 132.

The second switch device 134 is set between the positive node A and second positive terminal 135. A first switch terminal of the second switch device 134 connects to the positive node A, and a second switch terminal of the second switch device 134 connects to the second battery receptacle 102 or the second positive terminal 135. The second switch device 134 is closed to form the electrical connection between the first battery or battery pack and the motor, or opened to cut off the electrical connection of the second battery or battery pack and the motor 138.

In one embodiment, the second switch device 134 includes one or more transistors such as MOSFETs or power MOSFETs. In one form, the second switch device 134 is a MOSFIELD EFFECT TRANSISTOR. In another form, the second switch device 134 is a circuit module with similar switch functions. The circuit module also has a first connection point or terminal for connecting to the positive node A and a second connection point or terminal for connecting to the second positive terminal 135.

In the power tool 13, the second switch device 134 may use the same semiconductor element as the first switch device 131 or be a circuit module having similar switching functions.

As shown in FIG. 2, the first battery pack 11 and the second battery pack 12 plug in the power tool 13 respectively. The first positive pole 111 connects to the first positive terminal 132. The first negative pole 113 connects to the first negative terminal 133. The second positive pole 121 connects to the second positive terminal 135. The second negative pole 123 connects to the second negative terminal 136.

Due to the first positive terminal 132 and the second positive terminal 135 connecting to the common positive node A and the first negative terminal 133 and the second negative terminal 136 connecting to the common negative node B, the battery pack 11 and the battery pack 12 are set in parallel to supply power for the motor 138 when the switch 137 is closed.

Assume the voltage of the first battery pack 11 is higher than that of the second battery pack 12, and the first switch device 131 and the second switch device 134 are supposed to be closed at an initial condition.

Due to the first negative terminal 133 and the second negative terminal 136 connecting to a common ground potential point, the voltage of the first positive terminal 132 is higher than that of the second positive terminal 135.

As shown in FIG. 2, the first switch device 131 and the second switch device 134 are MOSFET each with two connecting terminals and a control terminal. The two connecting terminals of the first switch device 131 is connected in series between the first positive terminal 132 and the positive node A. Turn off the first switch device 131, current from the first positive terminal 132 flows into the positive node A through the two connecting terminals of the first switch device 131.

Controller 139a is set for detecting across the first switch device 131a first voltage drop, which is defined by a potential or voltage drop between the first terminal and the second terminal of the first switch device 131 along the current direction, or between the positive node A and the first positive terminal 132 due to the connection of the first terminal to the positive node A and the connection of the second terminal to the first positive terminal 132. In other words, the first voltage drop of the first switch device 131 detected by the controller 139a along the current direction equals to the potential or voltage drop from a high potential point of the first positive terminal 132 to a low potential point of the positive node A. Assume that the first voltage drop across the first switch device 131 along the current direction is less than a first control voltage which is set for initiating the first switch device 131 and/or the controller 139a, the controller 139a sends a signal to cause the first switch device 131 opened to disconnect the first battery pack 11 and the motor 138. That is, if the first voltage drop as detected from the high potential point of the first positive terminal 132 to the low potential point of the positive node A is less than the first control voltage, the controller 139a will control the first switch device 131 opened to cut off the electrical connection of the first battery or battery pack 11 and the motor 138. The first control voltage has a value greater than zero, and set for initiating the first switch device 131 and/or the controller 139a. That is, if the first voltage drop as detected from the high potential point of the first positive terminal 132 to a low potential point of the positive node A is greater than the first control voltage, the controller 139a enables the first switch device 131 closed to form the electrical connection of the first battery or battery pack 11 and the motor 138.

Controller 139b is set for detecting across the second switch device 134a second voltage drop along the current direction. When the second voltage drop as detected is less than a second control voltage, the controller 139b sends a signal to cause the second switch device 134 opened to disconnect the second battery or battery pack 12 and the motor 138.

In the embodiment of FIG. 2, the voltage of the first battery pack 11 is supposed to be higher than that of the second battery pack 12, it is known that the potential point of the first positive terminal 132 is higher than that of the positive node A, and the potential point of the second positive terminal 134 is lower than that of the positive node A. Controller 139a detects the first voltage drop across the first switch device 131 along the current direction, and the first voltage drop as detected is greater than the first control voltage which is set for initiating the first switch device 131 and/or the controller 139a, the controller 139a sends a signal to cause the first switch device 131 closed to conduct or form the electrical connection of the second battery or battery pack 11 and the motor 138, while controller 139b detects the second voltage drop across the second switch device 134 along the current direction, and the detected second voltage drop is less than a second control voltage which is set for initiating the second switch device 134 and/or the controller 139b, the controller 139b sends a signal to cause the second switch device 134 opened to cut off or disconnect the second battery or battery pack 11 and the motor 138. Thus, the first battery pack 11 cannot power the second battery pack 12 so as to avoid the current flow from the first battery pack 11 at a high voltage to the second battery pack 12 at a lower voltage. It should be appreciated that the voltage drop of the first switch device 131 is greater than or equal to the first control voltage which is set for initiating the first switch device 131 and/or the controller 139a, the connection of the first battery 11 to the motor 139 is enabled by the first closed switch device 131 so as to permit the power tool to be powered merely by the first battery 11 with a higher voltage.

Assume the voltage of the first battery pack 11 is equal to the voltage of the second battery pack 12, by detecting the first voltage drop and the second voltage drop both of which are greater than a corresponding control voltage, controller 139a controls the first switch device 131 and the second switch device 134 closed to permit the power tool to be powered by both of the first battery pack 11 and the second battery pack 12 connected in parallel. It should be noted that when a number of battery packs 12 are provided, certain switch devices or more than two switch devices associated with the battery packs 12 are detected to have a respective voltage drop greater than a corresponding control voltage, controller or controllers control the switch devices closed so as to enable the associate parallel-connected battery packs with the same voltage to power for the power tool.

Thus, no matter the first battery pack 11 and second battery pack 12 are inserted in the power tool 13 simultaneously or in sequence, the first battery pack 11 and the second battery pack 12 are controlled to power the power tool 13 simultaneously at the time the voltage of the battery pack 11 as detected is reduced to be equal to the voltage of the second battery pack 12. The current flow from the battery pack 11 at a high voltage to the battery pack 12 at a low voltage can be avoided.

To prevent over-discharge of the battery back 11, the controller 139a operable to detect a voltage of the first battery pack 11, send a signal to interrupt or cut off the connection of the first battery pack 11 and the motor when the voltage of the first battery pack 11 is less than a first voltage threshold.

To prevent over-discharge of the battery back 12, the controller 139b operable to detect a voltage of the second battery pack 12, send a signal to interrupt or cut off the connection of the second battery pack 12 and the motor when the voltage of the second battery pack 12 is less than the second voltage threshold.

In one form, the controller 139a may be operable to detect a current which flows from the first terminal to the second terminal of the first switch device 131. When the current as detected is less than a predetermined current, the controller 139a sends a signal to cause the first switch device 131 opened so as to cut off the connection of the first terminal and the second terminal of the first battery pack 11. It should be noted the predetermined current has a value greater than zero.

In one form, the controller 139b may be operable to detect a current which flows from the first terminal to the second terminal of the second switch device 134. When the detected current is less than a predetermined current, the controller 139b sends a signal to cause the second switch device 134 opened to disconnect the connection of the first switch terminal and the second switch terminal.

Figure 3:
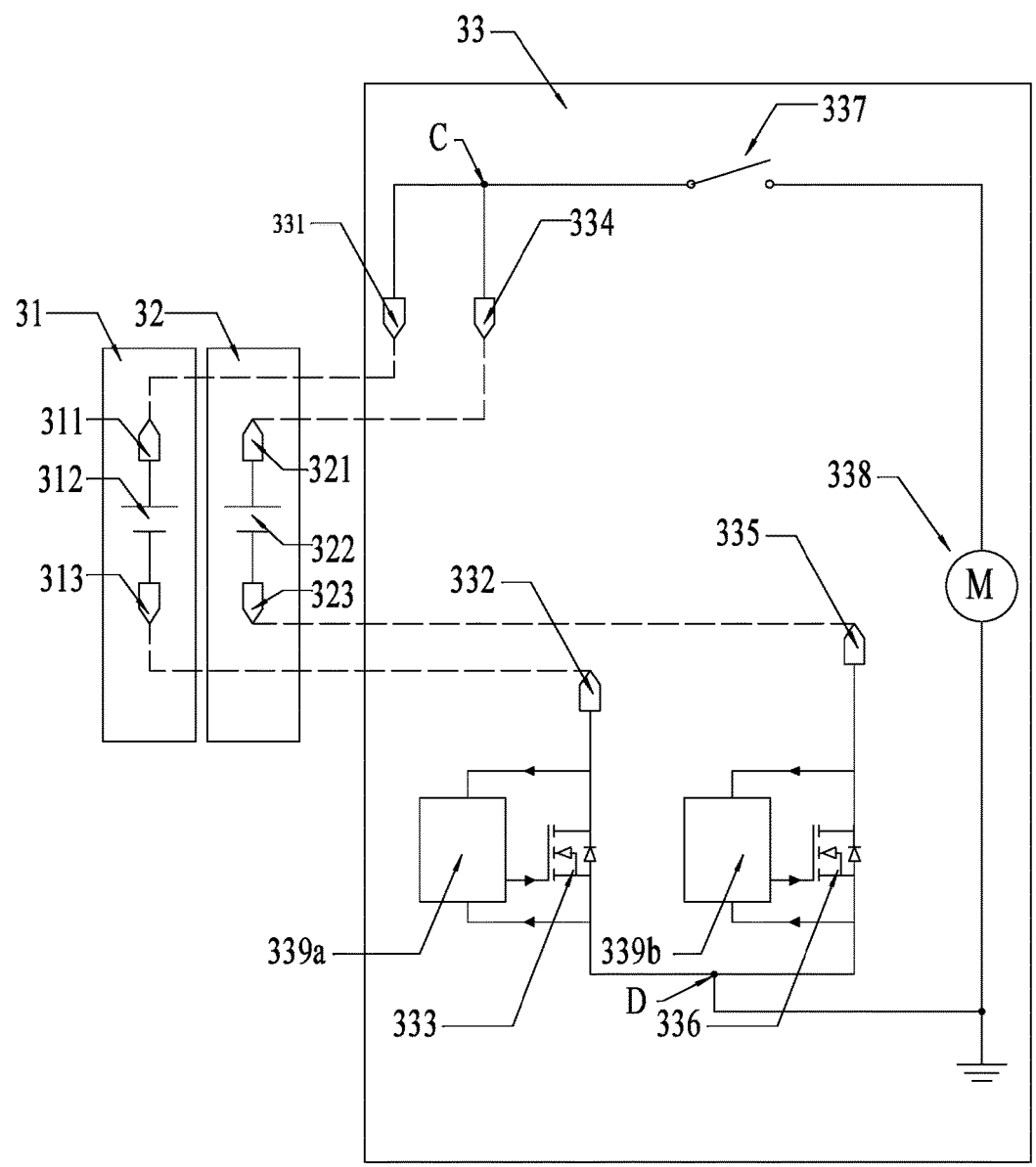
FIG. 3 is a circuit diagram illustrating another exemplary circuit of the power tool with battery packs.

In an alternative embodiment shown in FIG. 3, a first switch device 213 and a controller 212 can be set within a first battery pack 21. In other words, the first switch device 213 and the controller 212 can be disposed within a housing of the first battery pack 21. A second switch device 223 and a controller 222 can be set within a second battery pack 22.

In FIG. 3, the first switch device 213 connects between the first positive terminal 211 and the positive pole of the battery cells 214. The second switch device 223 connects between the second positive terminal 221 and the positive pole of battery cells 224.

As shown in FIG. 3, the first switch device 213 and the second switch device 223 are MOSFIELD EFFECT TRANSISTOR. The first controller 212 connects to the control terminal of the first switch device 213 for controlling the first switch device 213 on or off. The second controller 222 connects to the control terminal of the second switch device 223 for controlling the second switch device 223 on or off.

The first battery pack 21 and the second battery pack 22 plug in the power tool 23, the first positive pole 211 connects to the first positive terminal 231. A first negative pole 215 connects with a first negative terminal 232. A second positive pole 221 connects with a second positive terminal 233. A second negative pole 225 connects with a second negative terminal 234.

Turn on a switch 235, the battery pack 21 and the battery pack 22 are set in parallel for powering the motor 236 as the same as the FIG. 2. The first controller 212 and the second controller 222 operate to detect the corresponding voltage of the switch device 213, 223 and send a first signal to disconnect the corresponding switch which has a voltage drop less than the predetermined voltage In a preferred embodiment shown in the FIG. 4, a power tool 33 is configured to connect with a first battery pack 31 and a second battery pack 32.

When the first battery pack 31 and the second battery pack 32 plug in the power tool 33 respectively, a first positive pole 311 connects with a first positive terminal 331, a first negative pole 313 connects with a first negative terminal 332, a second positive pole 321 connects with a second positive terminal 334, and a second negative pole 323 connects with a second negative terminal 335. Turn on a switch 337; the battery pack 11 and the battery pack 12 are connected in parallel for powering the motor 138.

Figure 4:
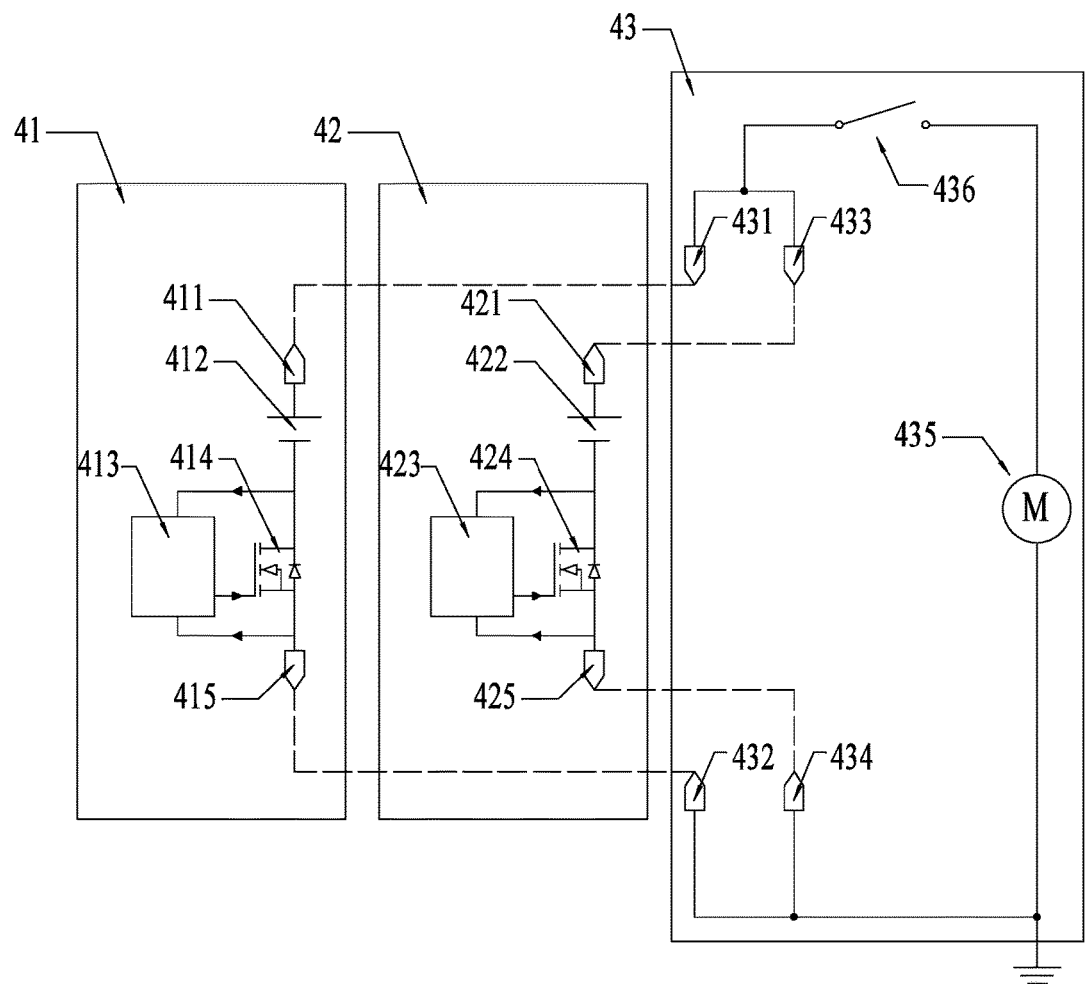
FIG. 4 is a circuit diagram illustrating another exemplary circuit of the power tool with battery packs.
Figure 5:
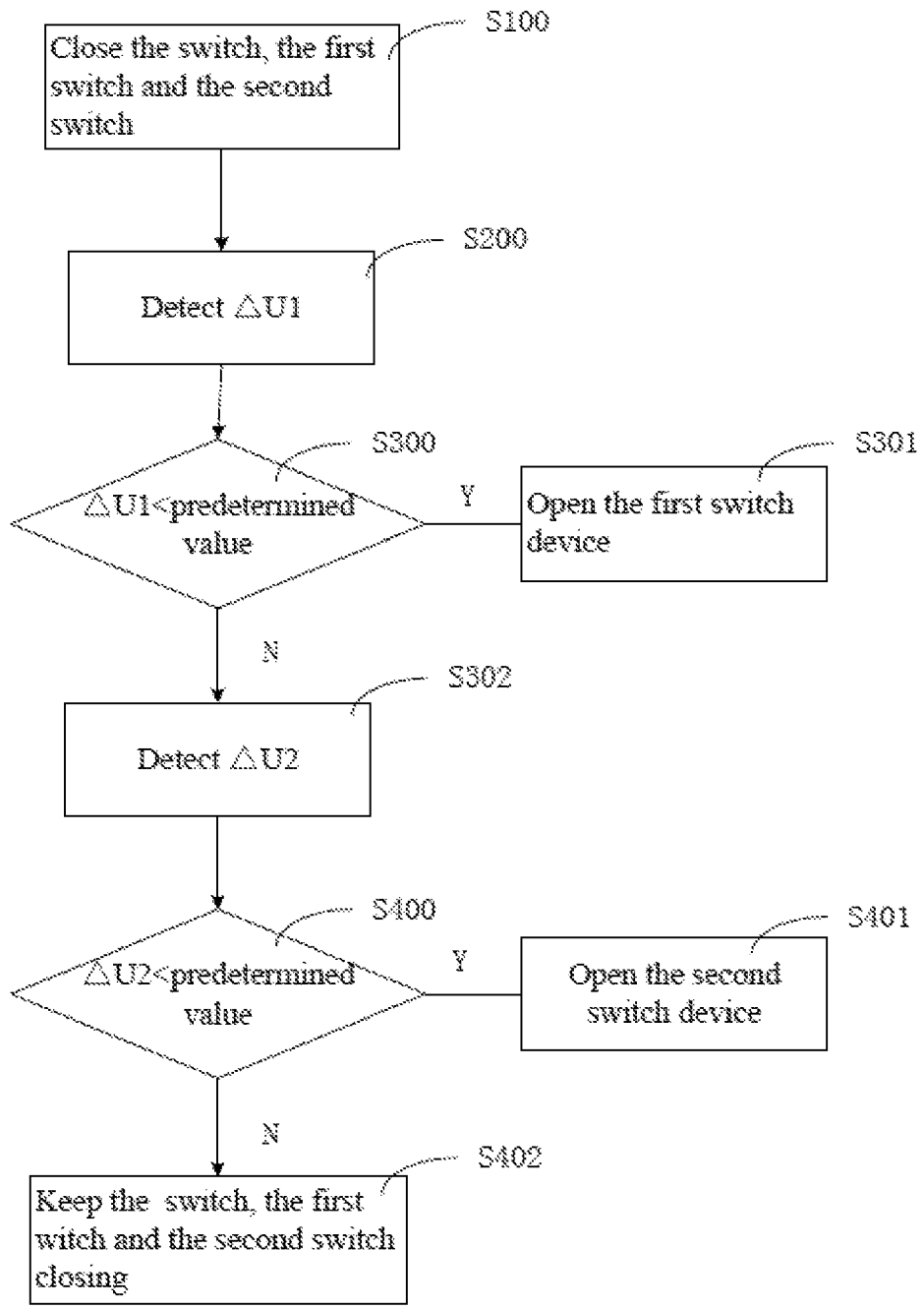
FIG. 5 is a circuit diagram illustrating another exemplary circuit of the power tool with battery packs.

The difference between the power tool 33 of FIG. 4 and the power tool 13 as shown in FIG. 1 is that the first switch device 333 is set between a negative node D and the first battery receptacle or the first battery, the second switch device 336 is set between the negative node D and the second battery receptacle or the second battery.

In FIG. 4, the first switch device 333 is MOSFET. It includes a first switch terminal for connecting to the negative node D, the second switch terminal for connecting to the first negative terminal 332 and a control terminal for connecting the first controller 339a.

The second switch device 336 is MOSFET as well. It includes a first switch terminal for connecting the negative node D, the second switch terminal for connecting the second negative terminal 335 and a control terminal for connecting the second controller 339b.

The first positive terminal 331 and the second positive terminal 334 both connect to the positive node C.

The control terminal of the first controller connects with the control terminal of the first switch device 333. The first controller 339a detects a first voltage drop across the first switch device 333 along the current direction. When the first voltage drop of the first switch device 333 is less than a first predetermined voltage, the first controller 339a sends a signal to cause the first switch device 333 opened to disconnect the first battery pack 31 and the motor 338. Turn on a switch 337, the first battery pack 31 and the motor 338 form a current loop.

The control terminal of the second controller 339b connects with the control terminal of the second switch device 336. The second controller 339b detects a second voltage drop across the second switch device 336 along the current direction. When the second voltage drop of the second switch device 336 is less than a second control voltage, the second controller 339b sends a signal to cause the second switch device 336 opened to disconnect the second battery pack 32 and the motor 338. Turn on the switch 337, the second battery pack 32 and the motor 338 form a current loop.

Assume the voltage of the first battery pack 31 is higher than the voltage of the second battery pack 32 in FIG. 4. Turn on the switch 337, the voltage of the first negative terminal 332 is less than that of the negative node D, the first switch device 333 is controlled to be on or closed, the current from the first terminal or the negative node D of the first switch device 333 flows to the second terminal or the first negative terminal 332 of the first switch device 333. Thus, the first voltage drop of the first switch device 333 along the current direction is greater than the first control voltage, controller 339a controls the first switch device 333 closed to form the electrical connection of the first battery or battery pack 31 and the motor 338.

The second controller 339b detects a second voltage drop between the first terminal and the second terminal of the second switch device 336. The second voltage drop as detected along the current direction is less than a second control voltage due to the voltage of the second negative terminal 335 greater than that of the negative node D, the second controller 339b sends a signal to turn off or open the second switch device 336. Thus, the first battery pack 31 cannot power the second battery pack 32 and the second battery pack 32 cannot output current so as to avoid the current flow of the first battery pack 31 at a high voltage into the second battery pack 32 at a low voltage. It should be appreciated that the voltage drop of the first switch device 331 along the current direction is greater than or equal to the first control voltage which is set for initiating the second switch device 336 and/or the controller 339b, the connection of the first battery pack 31 and the motor 338 is enabled to permit the power tool powered by the first battery 31.

Assume the voltage of the first battery pack 31 is equal to the voltage of the second battery pack 32 in FIG. 4, the first controller 339a turns on or closes the first switch device 333 and the second controller 339b turns on or closes the second switch device 336 such that the power tool is powered by both of the battery packs 31, 32 connected in parallel.

To prevent over-discharge of the battery pack 31, the first controller 339a operable to detect a current voltage of the first battery pack 31, sends a signal to interrupt the connection of the first battery pack and the motor when the current voltage of the first battery pack is less than a first voltage threshold value which is set for preventing the over-discharge of the battery pack 31.

To prevent over-discharge of the battery back 32, the second controller 339b operable to detect a current voltage of the second battery pack 32, sends a signal to interrupt the connection of the second battery pack and the motor when the current voltage of the second battery pack is less than a second voltage threshold value which is set for preventing the over-discharge of the second battery pack 32.

In an alternative embodiment, the first controller 339a operable to detect a current of the first switch device 333, sends a signal to turn off or open the first switch device 333 when the current of the first switch device 333 is less than a first current threshold.

The second controller 339b operable to detect a current of the second switch device 336, sends a signal to turn off or open the second switch device 336 when the current of the second switch device 336 is less than a second current threshold.

In another embodiment shown in FIG. 4, a first switch device 414 and a controller 413 can be set within a first battery pack 41. A second switch device 424 and a controller 423 can be set within a second battery pack 42. In other words, the first switch device 414 and the controller 413 are disposed within a housing of the first battery pack 41, and the second switch device 424 and the controller 423 are disposed within a housing of the second battery pack 42. The first switch device 414 connects between a first negative terminal 415 and a negative pole of the first battery cell or cells 412. The second switch device 424 connects between a second negative terminal 425 and a negative pole of the second battery cell or cells 422.

The first switch device 414 and the second switch device 424 are MOSFIELD EFFECT TRANSISTOR. The controller 413 connects to the control terminal of the first switch device 414 for controlling the connection or disconnection of the first switch device 424. The controller 423 connects to the control terminal of the second switch device 424 for controlling the connection or disconnection of the second switch device 424.

The first battery pack 41 and the second battery pack 42 plug in the power tool 43, the first positive pole 411 connects with a first positive terminal 431. The first negative pole 415 connects with the first negative terminal 432. The second positive pole 421 connects with the second positive terminal 433. The second negative pole 425 connects with the second negative terminal 434.

Turn on a switch 436, the battery pack 41 and the battery pack 42 are connected in parallel for powering the motor 435. The controller 413, 423 operable to detect the voltage of the switch device 414, 424 and sends a signal to open the switch which has a voltage drop less than the first or second control voltage.

A method of controlling a power tool with a plurality of battery packs connected in parallel, the power tool comprising: a plurality of battery receptacles each including a positive terminal for connecting the positive electrode of the battery pack and a positive node and a negative terminal for connecting the negative electrode of the battery pack and a negative node, a plurality of switch devices each including a first switch terminal that connects with the negative node and a second switch terminal connectable with the corresponding battery receptacle, a motor connected between the positive node and the negative node; a controller for detecting the voltage drop along the current direction between the first connect terminal and the second connect terminal of each of the switch devices; the method includes: turning on or closing the plurality of switch devices so as to permit the motor be powered by the battery packs; detecting a voltage drop value between the first switch terminal and the second switch terminal of each of the switch devices; judging or determining whether the voltage drop across the respective switch device along the current direction is less than a predetermined value; when the voltage drop of the switch device along the current direction is less than the predetermined value, the controller sends a signal to interrupt the connection between the first connect terminal and the second connect terminal of the switch device or open the switch device to disconnect the battery pack with the motor, thus preventing the current flow of the first battery pack or packs at a high voltage into the second pack at a low voltage to enable the motor to be powered merely by the first battery pack or packs.

Obviously, when the plurality of the switch devices are closed, the switch devices connected in parallel result in the connection of the battery packs in parallel.

Further, the method comprising: the controller detects a voltage of each of the battery pack; interrupts the connection of the battery pack and the motor when the voltage of a corresponding battery pack is less than a voltage threshold.

Figure 6:
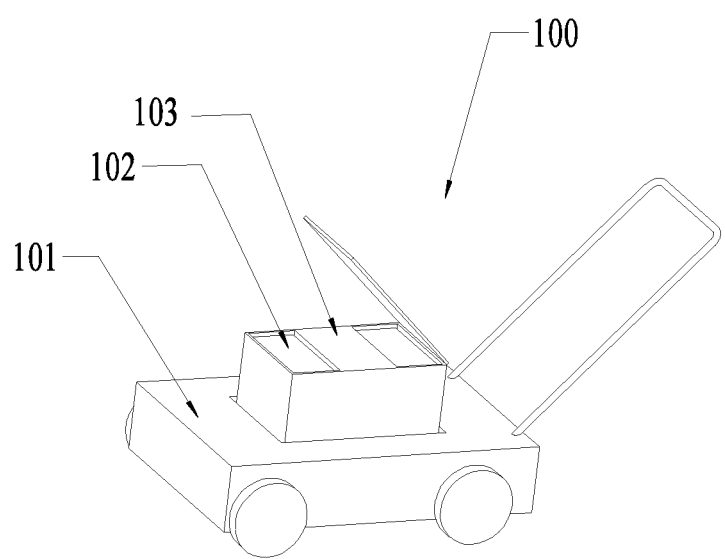
FIG. 6 is a flow diagram of an exemplary control method for a power tool.

As shown in the FIG. 6, a method of controlling a power tool with two battery packs or batteries connected in parallel, the method comprising:

S100: turning on or closing the switches including the first switch device and the second switch device at the initial condition; thereby the first switch device conducting the connection between the first battery pack and the power tool; the second switch device conducting the connection between the second battery pack and the power tool;

S200: detecting a voltage drop of the first switch device $\Delta U1$;

S300: judging or determining whether the voltage drop of the switch device $\Delta U1$ is less than a first control voltage;

S301: when $\Delta U1$ is less than the first control voltage (the first control voltage value is greater than zero), turn off or open the first switch device; thus the power tool is merely powered by the second battery pack which is supposed to have a voltage higher than that of the first battery pack;

S302: when $\Delta U1$ is larger than or equal to the first control voltage value, go to S400;

S400: detect a voltage drop of the second switch device $\Delta U2$;

S401: when $\Delta U2$ is less than the second control voltage, turn off the second switch device; thus the power tool is powered merely by the first battery pack which is supposed to have a voltage higher than that of the second battery pack;

S402: when ΔU2 is larger than or equal to the second control voltage controlling the second switch still closed, thus both of the first switch device and the second switch device kept closed, the first battery pack and the second battery pack are connected in parallel for powering the power tool.

Further, the method comprising: the controller detects a current voltage of the first battery pack or battery; interrupts the connection of the first battery pack or battery and the motor when the first battery pack has a voltage less than that of a first voltage threshold which is set for preventing the over-discharge of the first battery pack or battery The controller detects a current voltage of the second battery pack or battery; interrupts the connection of the second battery pack or battery and the motor when the second battery pack has a voltage less than a second voltage threshold which is set for preventing the over-discharge of the second battery pack or battery.

As shown in FIG. 1, a power tool as a mower 100 is shown. The mower 100 generally comprises a body 101, a first battery pack 11, a second battery pack 12, etc.

The body 101 includes battery receptacles 101, 102 for receipt of the battery packs 11, 12 attached to the mower 100. In the illustrated construction, the mower 100 includes two battery receptacles 101, 102, each operable to connect a corresponding battery pack 11, 12. Particularly, the battery receptacles 101 and the battery receptacles 102 are placed side by side or set in a line on the body 101 and connected in parallel.

In another construction, the power tool includes more than two battery receptacles operable to receive a number of battery packs.

In one form, the battery packs 11, 12 are rechargeable lithium-ion batteries. The battery pack 11 and the battery pack 12 have the same battery pack interface or port and the same nominal voltage.

The above illustrates and describes basic principles, main features and advantages of the present invention. Those skilled in the art should appreciate that the above embodiments do not limit the present invention in any form. Technical solutions obtained by equivalent substitution or equivalent variations all fall within the scope of the present invention.

What is claimed is:

1. A power tool, comprising:
    a motor;
    a first battery pack having a first battery;
    a second battery pack having a second battery connected in parallel with the first battery;
    a first battery receptacle for receipt of the first battery pack;
    a second battery receptacle for receipt of the second battery pack;
    a first switch device being connected between the first battery and the motor to form a first electrical connection between the first battery and the motor or cut off the first electrical connection between the first battery and the motor;
    a second switch device being connected between the second battery and the motor to form a second electrical connection between the second battery and the motor or cut off the second electrical connection between the second battery and the motor;
    a controller to
    detect a first voltage drop across the first switch device along the current direction, and control the first switch device opened to cut off the first electrical connection between the second battery and the motor when the first voltage drop is less than a first control voltage;
    detect a second voltage drop across the second switch device along the current direction, and control the second switch device opened to cut off the electrical connection between the second battery and the motor when the second voltage drop is less than a second control voltage, detect a voltage of the first battery pack, and cut off the connection of the first battery pack and the motor when the voltage of the first battery pack is less than a first voltage threshold; and
    detect a voltage of the second battery pack, and cut off the connection of the second battery pack and the motor when the voltage of the second battery pack is less than a second voltage threshold.

2. The power tool of claim 1, wherein the first control voltage value is greater than zero.

3. The power tool of claim 1, wherein the first switch device is field effect transistor.

4. The power tool of claim 1, wherein the second switch device is afield effect transistor.

5. The power tool of claim 1, wherein the first switch device is electrically connected to the second switch device such that the first battery pack and the second battery pack are connected in a parallel when both of the first switch device and the second switch devices are on.

6. The power tool of claim 1, wherein the first battery pack and the second battery pack are lithium cell and have the same nominal voltage and the same battery pack interface.

7. The power tool of claim 1, wherein the power tool is mower which comprises a body, the first battery receptacle and the second battery receptacle are set in a line on the body.

8. A power tool connected with a plurality of battery packs each having a positive electrode and a negative electrode thereof, the power tool comprising:
    a plurality of battery receptacles each including a positive terminal connecting the positive electrode of the battery pack and a positive node, and a negative terminal connecting the negative electrode of the battery pack and a negative node,
    a plurality of switch devices for the respective battery receptacles, each of the switch devices including a first switch terminal connected with the negative node, and a second switch terminal connected with the negative terminal of the battery receptacle;
    a motor connected between the positive node and the negative node;
    a controller to detect a voltage drop between the first switch terminal and the second switch terminal of a respective switch device along the current direction, and control the switch device opened to cut off the electrical connection between the first switch terminal and the second switch terminal when the voltage drop of the switch device is less than a control voltage.

9. The power tool of claim 8, wherein the predetermined value is greater than zero.

10. The power tool of claim 8, wherein the switch device is a field effect transistor.

11. The power tool of claim 8, wherein the first battery pack and the second battery pack are lithium cell and have the same nominal voltage and the same battery pack interface.

12. A method of controlling a power tool with a plurality of battery packs each having a positive electrode and a negative electrode, the power tool comprising:

a plurality of battery receptacles each including a positive terminal connecting the positive electrode of the battery pack and a positive node, and a negative terminal connecting the negative electrode of the battery pack and a negative node;

a plurality of switch devices each connected in series with the respective battery pack and the power tool, the switch device including a first switch terminal connected with the negative node and a second switch terminal connected with the negative terminal of the battery receptacle;

a motor connected between the negative node and the positive node;

and a controller controlling the switch device and the motor, the method comprising:

closing the plurality of switch devices;

detecting a voltage drop between the first switch terminal and the second switch terminal of each of the switch devices along the current direction, determining if the voltage drop across the respective switch device is less than a control voltage; and controlling the switch device opened to disconnect the battery pack with the motor when the voltage drop of the switch device is less than the control voltage.

13. The method of claim 12, wherein the predetermined value is greater than zero.

14. The method of claim 12, wherein the plurality of switch devices are connected in parallel, the plurality of battery packs a replaced in a parallel configuration.

15. The method of claim 12, further comprising, detecting a current voltage of a respective battery pack by the controller, interrupting the connection of the battery pack and the motor when the current voltage of the battery pack detected is less than a voltage threshold.

16. The method of claim 12, wherein the first battery pack and the second battery pack are lithium cells with a same nominal voltage and as a same battery pack interface.

\* \* \* \* \*